(12) United States Patent
Gupta et al.

(10) Patent No.: US 9,438,248 B2
(45) Date of Patent: Sep. 6, 2016

(54) LOW POWER DIGITAL SELF-GATED BINARY COUNTER

(71) Applicants: Naman Gupta, Delhi (IN); Amol Agarwal, New Delhi (IN); Gaurav Goyal, Greater Noida (IN)

(72) Inventors: Naman Gupta, Delhi (IN); Amol Agarwal, New Delhi (IN); Gaurav Goyal, Greater Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 123 days.

(21) Appl. No.: 14/568,115

(22) Filed: Dec. 12, 2014

(65) Prior Publication Data

US 2016/0173106 A1 Jun. 16, 2016

(51) Int. Cl.
| | |
|---|---|
| H03K 21/00 | (2006.01) |
| H03K 23/40 | (2006.01) |
| H03K 21/12 | (2006.01) |
| H03K 21/38 | (2006.01) |
| H03K 23/58 | (2006.01) |
| H03K 23/00 | (2006.01) |

(52) U.S. Cl.
CPC ............. *H03K 23/40* (2013.01); *H03K 21/00* (2013.01); *H03K 21/12* (2013.01); *H03K 21/38* (2013.01); *H03K 23/58* (2013.01); *H03K 23/00* (2013.01)

(58) Field of Classification Search
None
See application file for complete search history.

(56) References Cited

U.S. PATENT DOCUMENTS

| | | | |
|---|---|---|---|
| 5,818,895 A | * | 10/1998 | Oh ....................... H03K 23/588 377/116 |
| 6,269,138 B1 | | 7/2001 | Hansson |
| 6,434,588 B1 | | 8/2002 | Kim |
| 6,961,402 B1 | * | 11/2005 | Younis .................. H03K 23/54 377/106 |
| 7,145,978 B2 | | 12/2006 | Lewis |
| 2002/0075989 A1 | | 6/2002 | Joo |

OTHER PUBLICATIONS

Saleh Abdel-Hafeez and Ann Gordon-Ross, A Digital CMOS Parallel Counter Architecture Based on State Look-Ahead Logic, IEEE Transactions on Very Large Scale Integration (VLSI) Systems, vol. 19, No. 6, Jun. 2011, pp. 1023-1033.

* cited by examiner

*Primary Examiner* — Tuan T Lam
(74) *Attorney, Agent, or Firm* — Charles E. Bergere

(57) ABSTRACT

An n-bit counter is formed from cascading counter sub-modules. The counter includes combinatorial control logic coupled to a lower-order counter sub-module. The control logic includes a clock-gating integrated cell arranged to clock gate at least one higher-order counter sub-module dependent on a logical combination of outputs of the lower-order counter sub-module and to provide a multi-cycle path for resolution of a logical combination of outputs of any subsequent cascaded counter sub-modules. The control logic does not include any intervening memory device between the lower-order counter sub-module and the clock-gating integrated cell for use in determining a later control logic output.

13 Claims, 14 Drawing Sheets

201 → NEW APPROACH

LOW POWER DIGITAL SELF-GATED BINARY COUNTER

CROSS-REFERENCE TO RELATED APPLICATIONS

The present application is related to U.S. patent application Ser. No. 13/935,552 filed on Jul. 4, 2013.

BACKGROUND OF THE INVENTION

The present invention relates to digital counter circuits and, more particularly, to digital binary counter circuits.

A digital binary counter circuit is a logic circuit used for counting the number of times a particular event has occurred with respect to a base clock signal (CLK). A counter may be any arbitrary length (i.e., up to n-bits in length), with the maximum number of countable events being related to the counter bit length. For example, an 8-bit counter can count up to 256 events (i.e., up to $2^8$), while a 16-bit counter can count up to 65,536 events (i.e., up to $2^{16}$), etc.

Counter circuits are used in many integrated circuit designs, for example in an System on Chip (SoC), and may be formed of a set of sequential elements, such as flip-flops, operatively coupled together with suitable combinatorial control logic. As more features are being integrated into digital circuits, such as SoCs, the number of flip-flops used for the counter circuit portions, and therefore the amount of control logic used, is increasing. Furthermore, higher throughput necessitates operating such digital counters at ever higher frequencies. All this leads to a significant increase in dynamic power consumption of digital counters, or limited operational frequencies.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

FIG. 2 is a schematic block diagram and truth table according to an embodiment of the present invention;

DETAILED DESCRIPTION OF THE PREFERRED EMBODIMENTS

Figure 1:
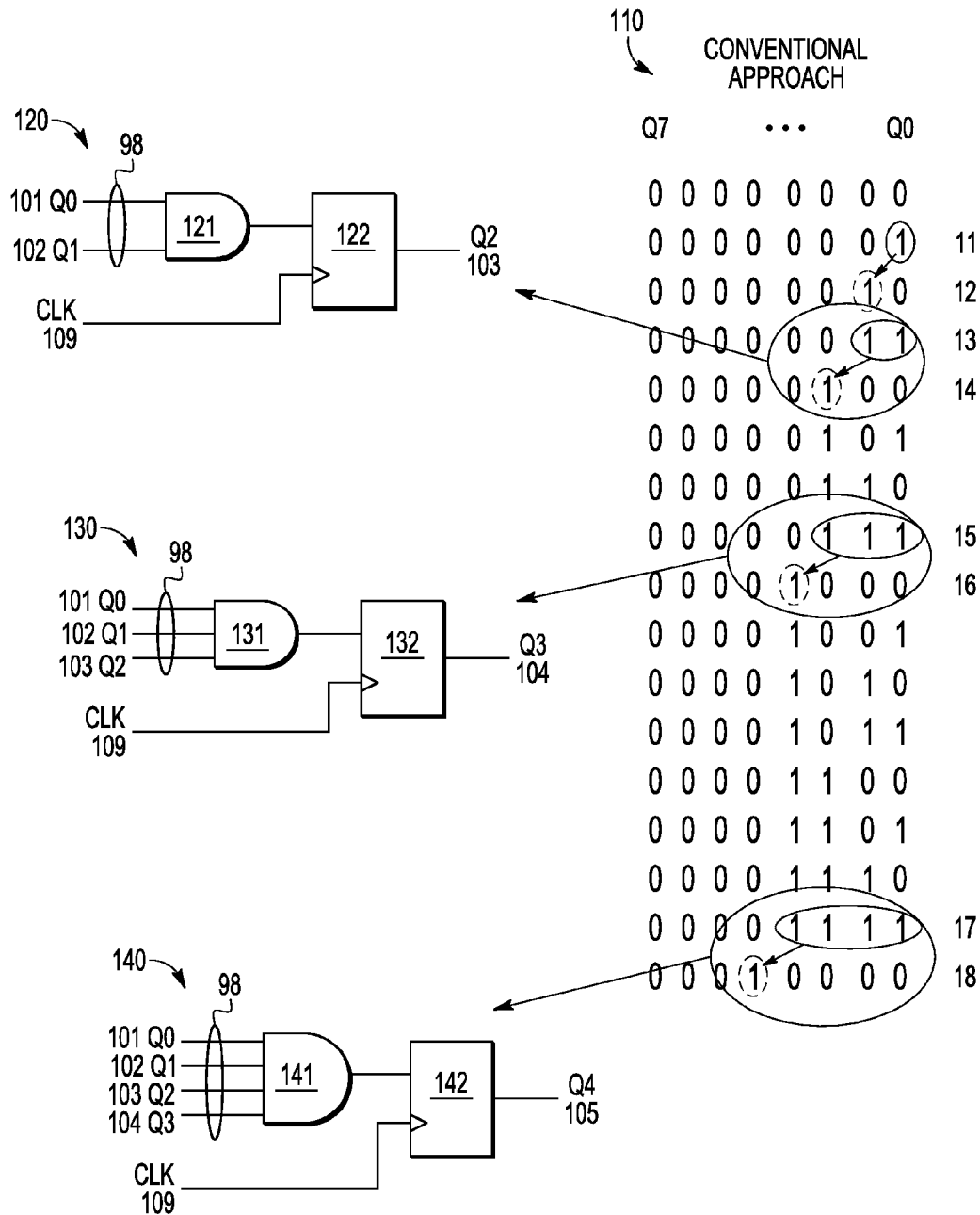
FIG. 1 is a schematic block diagram and truth table of a conventional approach to controlling the toggling of a portion of a counter circuit.

The subject matter of this application is related to the subject matter of U.S. patent application Ser. No. 13/935,552, filed on Jul. 4, 2013, the teachings of which are incorporated herein by reference. Any requirement of pipelining in the earlier application does not apply to the present application.

The present invention provides a binary counter that can operate at high frequency while consuming low dynamic power. A counter in which memory storage devices are not required to provide pipelining further reduces dynamic power consumption. Because the illustrated embodiments of the present invention may, for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

One way to increase throughput of a digital circuit is to increase operational frequency, but increasing frequency is limited not only by timing closure challenges, but also by increases in dynamic power consumption of the overall digital circuit (e.g., due to the switching losses in the circuitry, which are increased by increasing operational frequency). Embodiments of the present invention reduce the power consumption of digital counter circuits by employing clock gating of higher-order counting portions so that those higher-order portions of the circuit are enabled for operation only when actually required (as opposed to all the time), hence reducing/removing the switching losses for the disabled portions.

Moreover, the present invention increases operational frequency of the overall digital counter by limiting the fan-in and number of logic tiers (hereinafter this limitation may be called 'cone size') used for the combinatorial control logic that controls the enablement of respective ones of the counter sub-modules that are coupled together to form the overall digital counter. The limitation of the cone-size ensures that the maximum fan-in is kept equal to or less than the bit depth of the counter sub-modules used to form the overall digital counter for single clock cycle resolution of the control logic (e.g., 2-bit counter sub-modules=>fan-in of 2, 3-bit counter sub-modules=>fan-in of 3, 4-bit counter sub-modules=>fan-in of 4, etc.).

The combinatorial control logic may be considered as a plurality of instances of control logic, where each instance controls the enablement of the next higher-order counter sub-module. These, and all other, aspects of the invention will be described in more detail below, in the context of 4-bit, 8-bit, and 16-bit counters formed from 2-bit counter sub-modules, and a 12-bit counter formed from 3-bit counter sub-modules, respectively, from which it will become apparent how aspects of the invention (i.e., using clock gating) may be applied to any n-bit counter, to enable lower power consumption and faster operational frequency.

Examples may provide an n-bit counter circuit formed from a plurality of cascading counter sub-modules that include combinatorial control logic coupled to a lower-order counter sub-module of the overall counter circuit, where the combinatorial control logic may be arranged to clock gate at least one higher-order counter sub-module of the counter circuit based upon a logical combination of outputs of the lower-order counter sub-module.

The plurality of cascading counter sub-modules may be considered to each have a bit depth, and the combinatorial control logic may comprise multiple tiers of logic gates, where the first tier may be a plurality of logic gates, and the subsequent tiers may be a single logic gate. The first tier of a plurality of logic gates may form at least one input to a second tier logic gate, and the first tier may have a fan-in equal to the bit depth of the counter sub-modules. The first and second tiers of logic gates may comprise AND gates.

The n-bit counter design may be operable to ensure that a fan-in of a first tier of combinatorial control logic gates is equal to a bit depth of the plurality of cascading counter sub-modules.

Example n-bit counter circuits may further comprise at least one clock-gating integrated cell (CGIC) coupled between the lower-order counter sub-module and the higher-order counter sub-module, where the CGIC controls a clock input of the higher-order counter sub-module. Exemplary CGICs may comprise a latch having an output operatively coupled to a first input of a two-input AND gate, where the latch is operated by a changing logic level of a clock signal. The clock signal may be operatively coupled to a second input of the two-input AND gate, and an input to the latch may be a logically ANDed output of the lower-order counter sub-module.

The lower-order counter sub-module may be operable to count two least-significant bits of the counter circuit, and the higher-order counter sub-module may be operable to count the next two more-significant bits of the counter circuit. The input to the latch may be the logically ANDed output of the lower-order counter sub-module, and a least-significant bit input to an AND gate may be operably coupled to the output of the lower-order counter sub-module. A CGIC may be provided between each of the plurality of counter sub-modules. Examples may be particularly higher than a 4-bit counter.

The counter circuit may be formed from a plurality of 2-bit counter sub-modules, and, in which case, the combinatorial control logic may be arranged to ensure a maximum fan-in of the combinatorial control logic. The combinatorial control logic may comprise one or more tiers.

Examples may provide an instance of the control logic per instance of a higher-order counter sub-module of the counter circuit. The at least one higher-order counter sub-module of the counter circuit may be the next higher-order counter sub-module after the lower-order counter sub-module.

The plurality of cascading counter sub-modules may comprise a first, lowest-order, counter sub-module followed by a second, higher-order, counter sub-module cascaded off the first counter sub-module, where each subsequent counter sub-module cascades off a previous counter sub-module and is a yet-higher-order counter sub-module.

Examples may also provide an n-bit counter circuit, comprising an initial 4-bit counter sub-portion, wherein the initial 4-bit counter sub-portion comprises a first 2-bit counter sub-module arranged to count two least-significant output bits Q0 and Q1 of the n-bit counter circuit, a second 2-bit counter sub-module arranged to count the next two more-significant output bits of the n-bit counter circuit Q2 and Q3, and combinatorial control logic arranged to control a clock of the second 2-bit counter sub-module dependent on the outputs of the first 2-bit counter sub-module. The combinatorial control logic may comprise an AND gate arranged to determine a logical AND combination of Q1 and Q0 and a CGIC operable to clock gate the second 2-bit counter sub-module.

In some examples, the CGIC may comprise a latch having an output operatively coupled to a first input of a two-input AND gate, where the latch is operated by a changing logic level, e.g., a falling level, of a clock signal, and the clock signal may be operatively coupled to a second input of the two-input AND gate, and an input to the latch may be a logically ANDed output of the lower-order counter sub-module.

The aforementioned examples will now be described in more detail. A counter circuit is a periodic state machine. For example, in any n-bit counter, the last two bit values (i.e., 2 LSBs) will always change from 00→01→10→11, assuming an up-counter. Therefore, a technique can be employed to logically combine clock cycle data that can be used to generate desired output logic in combination with other logic operating on the current input signals. Thus, the logically combined data is able to reduce combinational cone size (i.e., fan-in and associated number of logic tiers) to the counter flip-flops and hence enable higher-frequency operation. This issue is explained in more detail in FIGS. 1 and 2, below.

FIG. 1 is a state diagram and portions of a counter circuit illustrating a conventional approach to controlling the toggling of a portion of a conventional counter circuit. In particular, there is shown a first portion of a logic state diagram 110, showing how counter bits Q0 to Q7 change for the first 17 clock cycles, and associated control logic portions 120, 130, and 140, for different-order bits of the counter circuit.

In general, for the conventional approach, it can be seen that any given higher-order bit toggles (i.e., flips) from binary logic value '0' to binary logic value '1' one clock cycle after all lower-order bits (LSBs) are binary logic value '1'. Thus, for example, as shown in FIG. 1, Q1 toggles to binary logic value '1', at line 12, only once Q0 has already turned to binary logic value '1', at line 11. Similarly, Q2 toggles to binary logic value '1' at line 14, only after both Q0 and Q1 have toggled to binary logic value '1', at line 13, and so on and so forth for each of the output bits of the counter. The similar situations for Q3 and Q4 are also shown at lines 15/16, and lines 17/18, respectively, of the state logic diagram 110.

The control logic portions 120-140 for the counter output bits Q2 to Q4, respectively, are shown on the left-hand side of FIG. 1. (Note that the control logic portions for the counter output bits Q0 and Q1 are omitted.) The Q2 control logic portion 120 comprises a two-input AND gate 121, with the inputs Q0 101 and Q1 102, feeding into a D flip-flop 122, which is controlled by the base clock signal CLK 109, to form the output Q2 103. The D flip-flop 122 stores the logic output of the AND gate 121 until the next clock triggering edge. It is to be noted that the fan-in 98 for the two-input AND gate 121 is 2. The counter illustrated in FIG. 1 uses positive edge-triggered flip flops in the counter modules. One skilled in the art could modify the counter modules to operate using negative edge-triggered flip flops.

Taking note of the logic state diagram 110, the Q3 control logic portion 130 comprises a three-input AND gate 131, with the inputs Q0 101, Q1 102, and Q2 103, feeding into a D flip-flop 132, which is controlled by the base clock signal CLK 109, to form the output Q3 104. The D flip-flop 132 stores the logic output of AND gate (the 3-input AND gate 131 in this case) until the next clock triggering edge. It is to be noted that the fan-in 98 is now 3.

In a similar fashion, the Q4 control logic portion 140 comprises a four-input AND gate 141, with the inputs Q0 101, Q1 102, Q2 103, and Q3 104, feeding into a D flip flop 142, which is controlled by the base clock signal CLK 109, to form the output Q4 105. The fan-in 98 is now 4, and, in general, it can be seen that the fan-in increases by one for each additional higher-order bit of the counter. Thus, a conventional counter can rapidly reach a very high fan-in for the associated control logic.

The above describes, in effect, all the combinatorial control logic needed for a 5-bit counter (i.e., having outputs Q0 to Q4), but the approach can be extrapolated out to any order (number of bits) counter. Thus, similarly, an 8-bit counter would require ANDing of the first 7 bits (i.e., Q0-Q6) to provide the output for Q7, and the performance of such a counter would be limited by the significant delay of a 7-input AND gate, or alternatively, 6 AND gates in series.

FIG. 2 is a state diagram illustrating an embodiment of the present invention, for example where modules of 2-bit counters have been used. The individual 2-bit counter sub-modules may be considered to be in a cascading formation.

As discussed above, under the conventional approach, a higher-order bit is dependent on all of the lower-order bits being binary logic value '1' as determined using a single, multiple-input AND gate having as many inputs as the number of lower-order bits that must be a logic value '1'. The first AND gate 310 (FIG. 3) is arranged to detect the inputs Q1 AND Q0. For the counter output bit Q2, only the first two bits, i.e., Q0 and Q1, matter for its determination. This is shown in the state logic diagram 201 at lines 21 and 22. For the counter output bits above Q2, when using the disclosed approach and 2-bit counter sub-modules to form the overall digital counter circuit, the counter combinatorial control logic may be arranged to detect '11' for the higher-order bits also. This is depicted in the state logic diagram 201 at lines 23 and 24.

While the above-described approach reduces the fan-in of the combinatorial control logic, thereby increasing operational frequency, examples of the invention also make use of clock gating to enable counter circuit portions (i.e., the individual 2-bit counter sub-modules) only as they are required, instead of all the time. It happens that the enablement of the required portions of the overall counter circuit may be carried out also on the basis of the combinatorial control logic. Thus, the improved combinatorial control logic of the invention in effect serves two synergistic purposes.

The methodology used for controlling the clock gating of different portions of the overall digital counter circuit will now be described in more detail.

Not all bits of an 'n' bit counter actually toggle each clock cycle during one complete counter cycle (where a 'counter cycle' is a complete cycle of counting from 0 to the highest count value the counter is capable of reaching, which is dependent on its bit depth). For example, for an 8 bit counter, counting from 00000000 to 11111111, during the first five cycles of operation, the output is 00 00 00 00→00 00 00 01→00 00 00 10→00 00 00 11→00 00 01 00. This shows that the six most-significant bits of the overall digital counter output do not toggle until the fifth clock cycle. Therefore, the clock can be gated for these higher-order portion(s) of the counter, and so on. Thus, examples of the present invention also provide power savings by clock gating unused portions of the overall counter circuit (generally the higher-order/more-significant bits), until they are actually ready for use. This is in contrast to conventional counter clock logic paths, that typically toggle continuously while the counter is in operation, regardless of whether their state is changing or not.

Aspects of the lower-power operation of examples of the invention are described in more detail with reference to FIG. 3, which shows an example of a new approach to controlling the toggling of a portion of a counter circuit according to an example of the invention.

Figure 3:
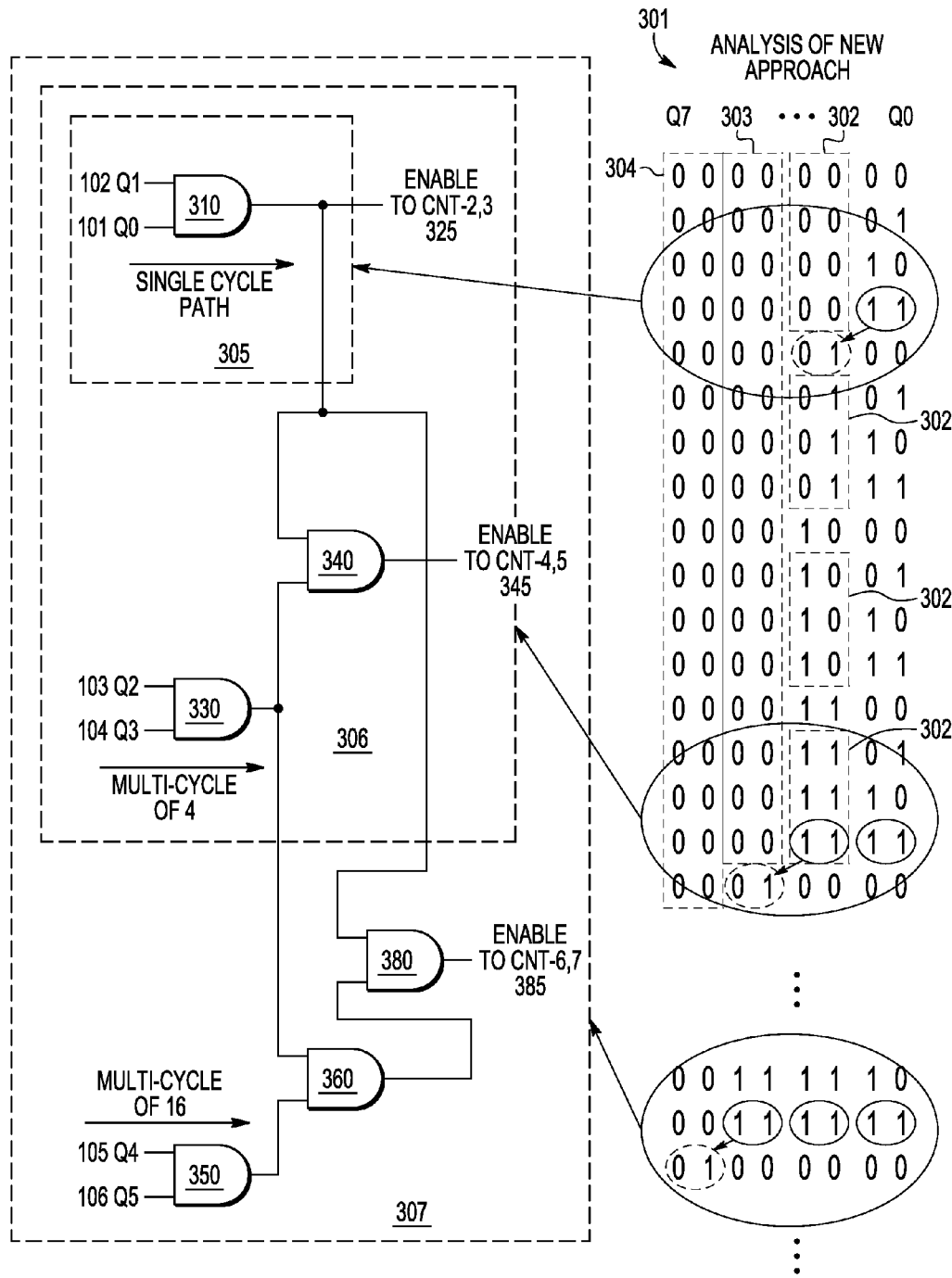
FIG. 3 is a schematic block diagram and a truth table illustrating a circuit for controlling the toggling of a portion of an n-bit counter circuit according to an embodiment of the present invention.

FIG. 3 is a schematic block diagram and a truth table illustrating a circuit for controlling the toggling of a portion of a counter circuit. The state diagram 301 illustrates portions that remain unchanged during the counting clock cycles shown. These areas include, for example, the area 302 for counter bits Q2 and Q3, the area 303 for counter bits Q4 and Q5, and the area 304 for counters bits Q6 and Q7 (as far as shown in the extract). During all these periods, it can be seen that the respective counter output bit values are unchanging, and as such, the counter circuit portions dealing with these can be turned off, by being clock gated.

Accordingly, examples of the invention use combinatorial control logic that detects certain bit arrangements that occur in advance of the respective higher-order bits turning from '0' to '1', and provide enable signals for the higher-order counter sub-modules dependent thereon (in the examples shown, counter sub-modules are 2-bit, but other bit-depth counter modules may be used instead). This approach allows counter circuits in accordance with embodiments of the present invention to enable the higher-order counter portions (i.e., the respective 2-bit counter sub-module) in time for when they are needed. FIG. 3 shows the provision of enable signals only for each of the multiple 2-bit counter sub-modules forming the overall digital counter circuit. In this description, the 2-bit counter sub-modules are labelled according to the output bits of the overall digital counter they provide—i.e., the 2-bit counter sub-module providing bits Q0 and Q1 is called CNT-0,1, the 2-bit counter sub-module providing bits Q2 and Q3 is called CNT-2,3, etc. The signals used by these circuits, such as enable signals, are named in a similar fashion.

In FIG. 3, a first combinatorial (enable) control logic portion 305 arranged to detect (Q1 AND Q0) using the AND gate 310 is illustrated at the top of the figure. The enable signal 325 is provided without any intervening memory device, such as a register, memory, or flip-flop in which to store a bit, between a lower counter sub-module and the next cascaded counter sub-module. For example, CNT-0,1 is a lower-order counter sub-module relative to the higher-order counter sub-module CNT-2,3. A clock-gating integrated cell, such as the CGIC 500, may be present between the lower- and higher-order sub-modules. Intervening flip-flops are not necessary between the lower-order counter sub-module CNT-0,1 and the higher-order counter sub-module CNT-2,3 to detect Q1 and Q0 as "11" because a single two-input AND gate 310 operates quickly to determine the enable signal 325. The AND gate 310 receives the inputs Q1 and Q0 and within less time than one clock cycle, presents a "1" as the enable signal 325 to CNT-2,3, as illustrated in FIG. 3. When the enable signal for the second 2-bit counter sub-module in the overall digital counter circuit, i.e., the counter sub-module CNT-2,3, turns to binary logic value '1' (i.e., goes high), that enable signal enables the clock to the 2-bit counter sub-module that is counting the overall digital counter circuit output bits Q2 and Q3, CNT-2,3. The CNT-2,3 enable signal 325 also acts as an input for other, subsequent, AND gate control logic arrangements used to control the enable signals for higher-order counter sub-modules, as discussed below.

FIG. 3 also illustrates, in the middle of the figure (left-hand side), a second (enable) control logic portion 306 arranged to detect ((Q3 AND Q2) AND (Q1 AND Q0)), in order to provide the enable signal 345 for the third 2-bit counter sub-module, i.e., the counter CNT-4,5, which enables the clock to the 2-bit counter sub-module that is counting the overall digital counter output bits Q4 and Q5. The enable signal 345 is provided without any intervening memory device, such as a register, memory, or flip-flop in which to store a bit, between the lower-order counter sub-module and the higher-order counter sub-module.

Intervening flip-flops are not necessary between the lower-order counter sub-module CNT-2,3 and the higher-order counter sub-module CNT-3,4 to detect Q3 and Q2 as "11" due to the multi-cycle path resulting in a relatively low frequency of change. The output of CNT-2,3 is at a lower effective clock rate. Using 2-bit sub-modules, the clock rate of the output of CNT-2,3 is one-fourth of the clock rate of the output of CNT-0,1. The lower effective clock rate, corresponds to providing a longer effective clock period which provides adequate time for the combinational logic to ripple through and settle by the time the enable signal 345 is needed. The additional time available during which the combinational logic establishes the enable signal 345 for higher-order counter sub-modules, obviates the need for a memory device between the lower-order counter sub-module and the higher-order module sub-module. The n-bit counter is not operational frequency constrained by a limitation on the fan-in of the combinational logic. Combinational logic in a single cycle path will typically be combined in at most two AND gates. Three or more AND gates can be used in series in the resolution of a logical combination of outputs from lower-order sub-modules to clock-gate a higher-order sub-module. The need to use three or more AND gates in series occurs in a multi-cycle timing path and can be accommodated due to the effective clock rate providing a longer effective clock period in multi-cycle paths for the combinational logic to ripple through and settle. The minimum multi-cycle path, using cascaded sub-modules having a two bit width, provides an effective clock cycle that is four times as long as the clock cycle of base clock signal CLK 109. This is sufficient time for the control logic to resolve and settle without sacrificing clock speed.

An n-bit counter circuit has a plurality of cascaded counter sub-modules including at least first and second cascaded counter sub-modules. The first and second counter circuit sub-modules may be consecutive ones of the cascaded counter sub-modules. The first counter sub-module is at least a lower-order counter sub-module relative to the second counter sub-module and the second counter sub-module is a higher-order counter sub-module relative to the first counter sub-module. The second counter sub-module may also be a lower-order counter sub-module relative to any subsequent cascaded counter sub-modules in the plurality of cascaded counter sub-modules. Control logic is coupled to the first counter sub-module. The control logic includes a clock-gating integrated cell (CGIC) arranged to clock at least the second counter sub-module of the counter circuit dependent on a logical combination of outputs of at least the first counter sub-module. The control logic also provides a multi-cycle path for resolution of a logical combination of outputs of any subsequent cascaded counter sub-modules of the counter circuit, dependent on a logical combination of the outputs of at least the second counter sub-module. As explained above, the control logic does not include any intervening memory device between the first counter sub-module and the CGIC for use in resolution of a logical combination of outputs.

As illustrated in FIG. 3 for 2-bit counter sub-modules, the bits remain stable for the duration of the stability of the lower of the two bits. For example, (Q0 AND Q1) remains stable for one cycle of the base clock signal CLK 109. This provides a single clock cycle of the base clock signal CLK 109 during which to resolve the control logic for the next cascaded sub-module. A two input AND gate is sufficient to resolve the status of (Q0 AND Q1) and is capable of such resolution in a single clock cycle of the base clock signal CLK 109. As shown in the area 302, (Q2 AND Q3) remains stable for four cycles of the base clock signal CLK 109, which provides a multi-cycle path of four clock cycles of the base clock signal CLK 109 during which to resolve the control logic for the next cascaded sub-module. Where the control logic requires more than two logic gates in series, the greater logic depth is capable of resolving the status of the control logic within the time available in a multi-cycle path. The minimum multi-cycle path in a counter circuit of cascaded 2-bit counter sub-modules is four cycles of the base clock signal CLK 109, which provides additional time to resolve the status of the control logic. As shown in the area 303, (Q4 AND Q5) remains stable for sixteen cycles of the base clock signal CLK 109, which provides a multi-cycle path of sixteen clock cycles of the base clock signal CLK 109 during which to resolve the control logic for the next cascaded sub-module. For two-bit counter sub-modules operating on more significant bits (e.g., Q6, Q7, Q8, Q9, etc.), even more clock cycles of the base clock signal CLK 109 are available during which to resolve the control logic for a subsequent cascaded sub-module.

Finally, FIG. 3 illustrates, at the bottom of the figure, a third (enable) control logic portion 307 arranged to detect ((Q5 AND Q4) AND (Q3 AND Q2)) AND (Q1 AND Q0)), in order to provide the enable signal 385 for the fourth 2-bit counter sub-module, i.e., the counter CNT-6,7, which enables the clock to the 2-bit counter sub-module that is counting the overall digital counter circuit output bits Q6 and Q7.

These three (enable) control logic portions 305-307 are merely exemplary of the general control logic scheme used to provide the enable signals for clock-gated (i.e., temporarily unused) higher-order/more-significant bit portions of the overall digital counter circuit according to examples of the invention, in order to save dynamic power (and to maximize operational frequency by limiting cone size).

The respective portions of the control logic are formed from suitably arranged logic gates, latches, and the like. For example, the second combinatorial enable control logic portion 306 is formed from combining the output of the first enable control logic portion 305 and ANDing it (using the AND gate 340) with the output of another AND gate 330, which is operable for ANDing Q2 and Q3. In a similar way, the third enable control logic portion 307 may be formed from combining the output of the first enable control logic portion 305 and ANDing it, using AND gate 380, with (Q5 AND Q4) AND (Q3 AND Q2)—i.e., using the AND gates 350, 360, and 330, respectively. The later, higher-order counter enable signals are derived in similar fashion, the general principles of which are explained in more detail below, especially with reference to FIG. 13.

The other basic building blocks of an overall digital counter circuit according to an example of the invention will now be described with reference to FIGS. 4 to 6.

Figure 4:
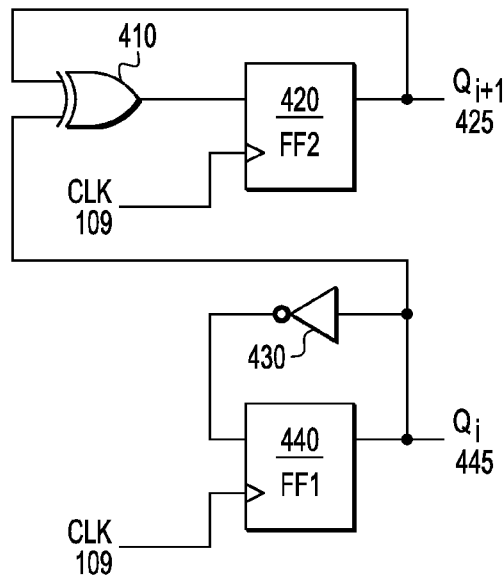
FIG. 4 is a schematic block diagram of a 2-bit counter sub-module according to an embodiment of the present invention.

FIG. 4 is a schematic block diagram illustrating a 2-bit counter sub-module used in examples according to the invention. It is shown in generic representation, i.e., it is shown as counting two consecutive output bits ($=Q_i$ and $Q_{i+1}$) of the overall counter circuit, hence is referred to as CNT-i,i+1, and referenced in the figure here, and later on as $400_{i,i+1}$. The values i and i+1 are to be replaced with the respective values of the output bits of the counter module, e.g., for Q0 and Q1, the counter is CNT-0,1, referenced as $400_{0,1}$, etc.).

The 2-bit counter sub-modules comprise a second D flip-flop 420, the output of which is $Q_{i+1}$ 425 (i.e., the highest-order output bit for the overall 2-bit counter sub-module). This output 425 feeds back to be a first input to an XOR gate 410. The output of the XOR gate 410 is the input to the second D flip-flop 420, which is operationally clocked by a clock signal, e.g., the base clock signal CLK 109. The other input to the XOR gate 410 is the output of a first D flip-flop 440, which is also the lowest-order output bit of the 2-bit counter sub-module, i.e., $Q_i$ 445. The input of the first D flip-flop 440 is an inverted version of the output $Q_i$ 445, provided by a NOT gate 430 coupled between the output 445 of the first D flip-flop 440, and the input to the first D flip-flop 440, as shown. The first D flip-flop 440 is also operationally clocked by the same clock signal as the second D flip-flop 420, e.g., the base clock signal CLK 109.

Figure 5:
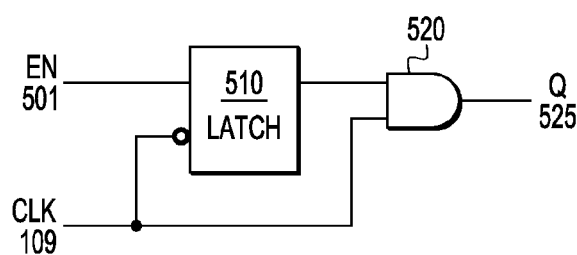
FIG. 5 is a schematic block diagram of a clock-gating integrated cell (CGIC) for use in clock gating the counter modules of FIG. 4 when they are not changing states in accordance with an embodiment of the present invention.

FIG. 5 is a schematic block diagram illustrating a clock-gating integrated cell (CGIC) 500 for use in clock gating higher-order bits (relative to the particular instance of the CGIC involved), according to an example of the invention. Multiple instances of the CGIC circuit are used in any given n-bit counter circuit, dependent on the number of bits, n, of the overall digital counter circuit and/or the bit-depth and the number of counter sub-modules used (see FIGS. 7, 8, 11, and 16, for 4-bit, 8-bit, 16-bit, and 12-bit overall digital counter circuits, using 2-bit and 3-bit counter sub-modules, respectively). For example, one CGIC per 2-bit or 3-bit counter sub-module. The CGIC 500 comprises an enable signal 501 feeding into the input of a D-type latch 510, the output of which forms the first input to a two-input AND gate 520, to provide the output Q 525. The enable signal 501 used for each instance of the CGIC is dependent on which subsequent counter sub-module is being enabled by the particular instance of the CGIC, but is generally derived from an earlier combinatorial logic calculation (see FIG. 3). For example, (Q1 AND Q0) is used for the first CGIC that controls the enable signal for the subsequent 2-bit counter sub-module CNT-2,3, whereas ((Q3 AND Q2) AND (Q1 AND Q0)) (i.e., the output of the second combinatorial enable control logic portion 306 discussed with reference to FIG. 3 above) is used for the second CGIC circuit that controls the enable signal for the subsequent 2-bit counter sub-module CNT-4,5, etc. The D-type latch 510 is clocked by an inverted clock signal (i.e., the latch 510 latches when its clock signal goes form high to low), for example, the base clock signal CLK 109. Accordingly, in operation, the CGIC circuit provides an output clock signal (Q 525) whenever the enable signal 501 is '1', where the rate of the output clock signal 525 is a function of the rate of the incoming clock signal, which is the base clock signal CLK 109 (in this example) and the enable signal 501 (in this example). While the embodiment of the counter circuit illustrated in FIG. 3 uses positive edge-triggered flip flops in the counter modules, the invention is not limited to positive edge-triggered flip flops. One skilled in the art could modify the counter modules to operate using negative edge-triggered flip flops.

Figure 6:
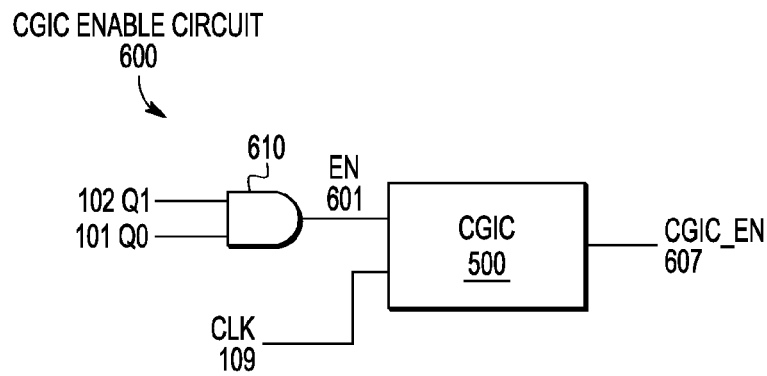
FIG. 6 is a schematic block diagram of a first CGIC enable control circuit for a first portion of a counter circuit according to an embodiment of the present invention.

FIG. 6 is a schematic block diagram illustrating an example first CGIC enable control circuit 600 for a first portion of a counter circuit according to an example of the invention, for use in 8-bit and above counters (an example use of which is described in FIG. 8 below). The CGIC_EN signal 607 (i.e., CGIC enable) is provided by enabling the CGIC circuit 500 using an enable signal 601 derived from the output of the previous combinatorial control logic instance, which in this example is an AND gate 610 arranged to detect (Q1 AND Q0). This AND gate 610 may be the same AND gate 310 as used to detect (Q1 AND Q0) as shown in FIG. 3.

Examples of the invention that use clock gating may be used in any counters of 4-bits and above. Higher-order counters may effectively reuse blocks, but with suitable modifications to the respective inputs used (e.g., changed to use the inputs Q8 to Q15, instead of Q0 to Q7), and including further connecting logic to take the input changes into account (see FIG. 11 for more details).

Figure 7:
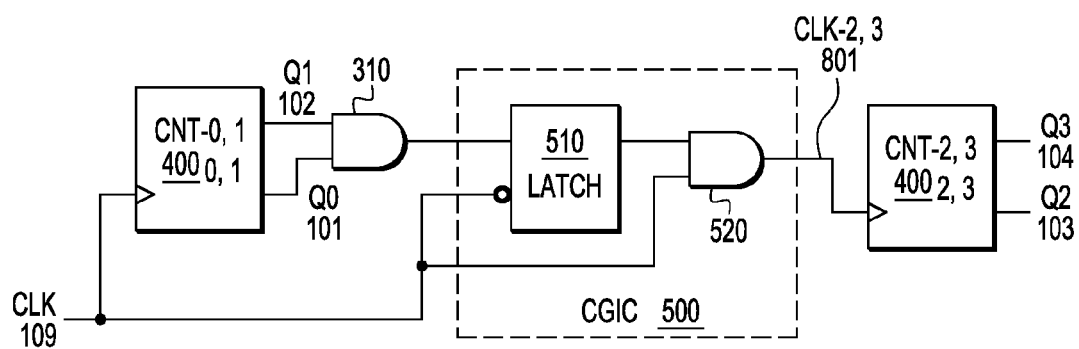
FIG. 7 is a schematic block diagram of a 4-bit counter according to an embodiment of the present invention.

FIG. 7 is a schematic block diagram illustrating a 4-bit counter according to an example of the invention, formed from the two 2-bit counter sub-modules CNT-0,1 $400_{0,1}$ and CNT-2,3 $400_{2,3}$, operatively coupled together through suitably formed enable control logic circuitry, as previously described. The example enable control logic instance shown is formed out of an AND gate 310 and the CGIC circuit 500, the CGIC 500 being formed of a D-type latch 510 and an AND gate 520.

The 4-bit counter of FIG. 7 operates by counting up the two least-significant bits (Q0 and Q1), and when Q1 and Q0 are '11' (i.e., (Q1 AND Q0)), the output of the AND gate 310 goes to '1' (i.e., goes high). This enables the CGIC 500 to feed the clock to the next-higher order counter sub-module, e.g., CNT-2,3 $400_{2,3}$, which then starts counting as and when required.

Figure 8:
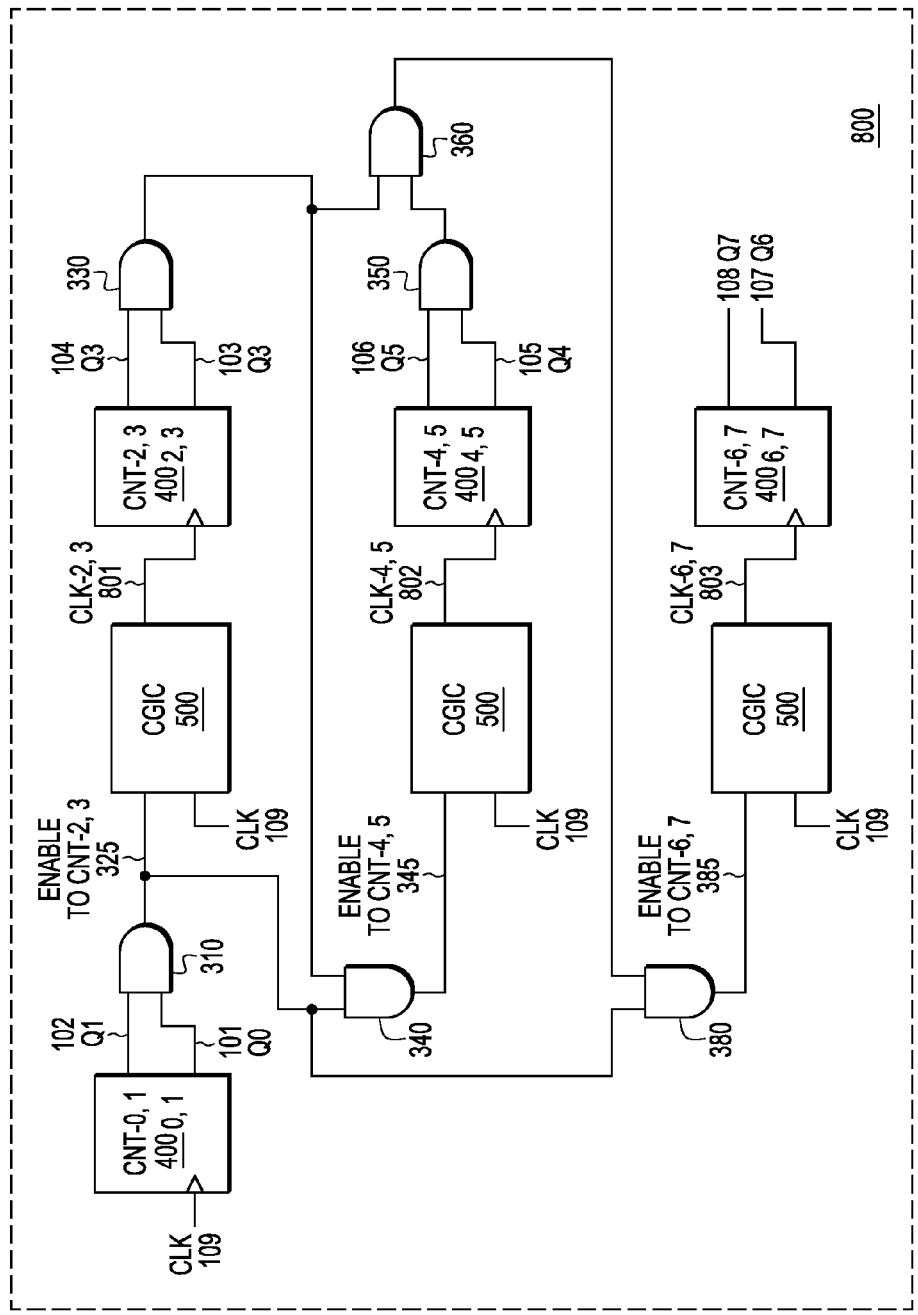
FIG. 8 is a schematic block diagram of an 8-bit counter according to an embodiment of the present invention.

FIG. 8 is a schematic block diagram illustrating an 8-bit overall digital counter circuit 800 according to an example of the invention, and is a high-performance self-gated 8-bit digital counter circuit. However, the circuit shown in FIG. 8 may also be used as a basic building block for a higher-order counter, for example a 16-bit counter circuit, as described in more detail in FIG. 11.

In the FIG. 8 example, the counter sub-modules $400_{i,i+1}$ are the basic 2-bit counter sub-modules described earlier in relation to FIG. 4 above. Modules 500 are CGICs, depicted in FIG. 5 and described above, which control the clock gating of the respective counter sub-modules $400_{i,i+1}$, as discussed in relation to FIG. 3 above.

Figure 10:
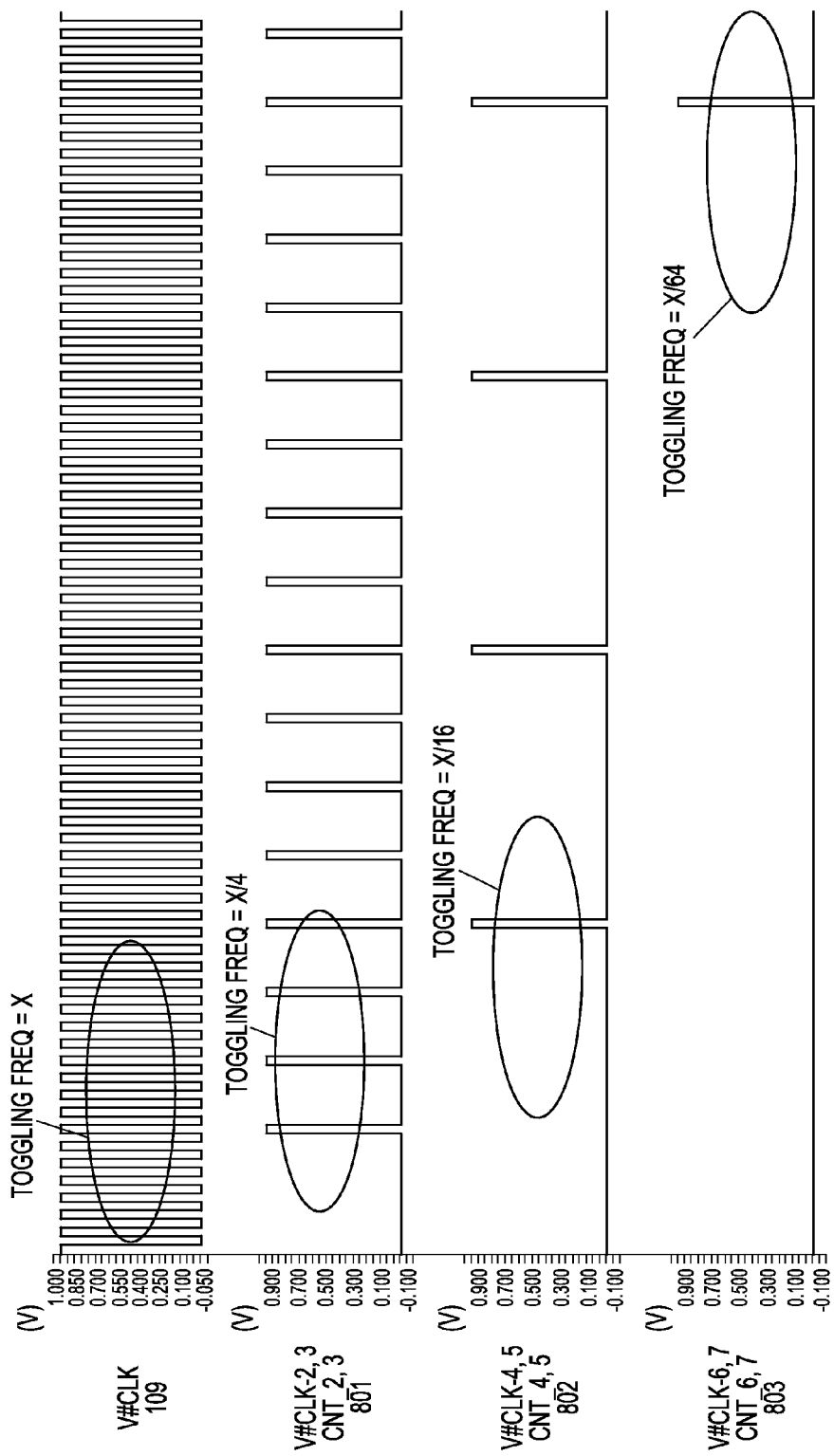
FIG. 10 is a timing diagram for a second set of signals of the circuit shown in FIG. 8 according to an embodiment of the present invention.

The high performance of the proposed overall digital counter circuit is a result of the implementation where any path has a maximum fan-in equal to the bit depth of the counter sub-modules being used, and in this way, the cone size is being limited to allow faster operation. The outputs of the overall 8-bit digital counter circuit 800 are represented by Q0 through Q7 (by the references 101 through 108, respectively). CLK-2,3, CLK-4,5, and CLK-6,7 are the respective clock-gated versions of the base clock signal CLK 109, which are reduced in frequency relative to the base clock signal CLK 109, as shown in FIG. 10.

In FIG. 8, the 8-bit digital counter circuit 800 shown has been split into modules of 2-bit counters each. An 8-bit counter would count up to $2^8=256$ cycles in total, and therefore the most-significant bit, i.e., Q7 would, change state from a logic 0 to a logic 1 only once during the entire operation of the counter over 256 cycles. Hence the clock to Q7 can be clock gated for all the cycles where Q7 does not toggle. However, because examples make use of 2-bit counter sub-modules, the output bits Q7, Q6 may be considered simultaneously to decide when to clock gate the block (i.e., subsequent higher-order counter sub-modules). For example, since valid output values for Q7 and Q6 can be either '00', '01', '10', or '11', the 2-bit counter sub-module CNT-6,7 changes state only four times during the 256 cycles. Hence, as depicted in FIG. 10, for a base clock signal rate of X Hz, the clock to module CNT-6,7 toggles at a frequency of (X*4)/256=X/64 Hz. The toggling (i.e., clock rate) of the other 2-bit counter sub-modules is similarly reduced in rate, for example: CNT-4,5 would toggle at (X*16)/256=X/16 Hz, and CNT-2,3 would toggle at (X*64)/256=X/4 Hz.

In other examples of the invention, differently sized counter sub-modules may be used instead of the 2-bit counter sub-modules proposed here. For example, 3-bit counter sub-modules, 4-bit counter sub-modules, etc. In each case, the fan-in of the respective first tier of the combinatorial control logic instances should be arranged to match the bit depth of the counter sub-modules, so that, for example, when using 3-bit counter sub-modules to form the overall counter circuit, the combinatorial logic may make use of 3-input AND gates in the first tier, just like 2-input AND gates have been used in the first tier of the combinatorial control logic described above where 2-bit counter sub-modules have been used. Similarly, when using 4-bit counter sub-modules, 4-input AND gates may be used in the combinatorial control logic, and so on. It may also be possible to use counter sub-modules of different/alternating sizes—e.g., 2-bit and 3-bit counters sub-modules within the same single, higher-order counter, or the like.

The clock to the 2-bit counter module CNT-0,1 is not gated (since the bits Q1 and Q0 do not depend on any previous bits, and bit Q0 toggles each clock cycle), so it still continues to receive the ungated clock, e.g., the base clock signal CLK 109, and hence it would continue to toggle at X Hz. As discussed above, any higher-order 2-bit counter sub-module would change state only after Q1 Q0 is '11' (i.e., (Q1 AND Q0)). Q2 Q3 would change state when Q1 Q0='11'. Hence, the enable signal for CNT-2,3 would involve one AND gate, e.g., AND gate 310. Meanwhile, Q4 Q5 would change state when Q1 Q0='11' and Q2 Q3='11'; hence, the enable for CNT-4,5 would use an additional two (making a total of three) AND gates, as described above in FIG. 3. Similarly, Q6 Q7 would change state when Q1 Q0='11' and Q2 Q3='11' and Q4 Q5='11'; hence, the enable for CNT-6,7 would use an additional two (making a total of four) AND gates, also shown in FIG. 3 above.

Figure 9:
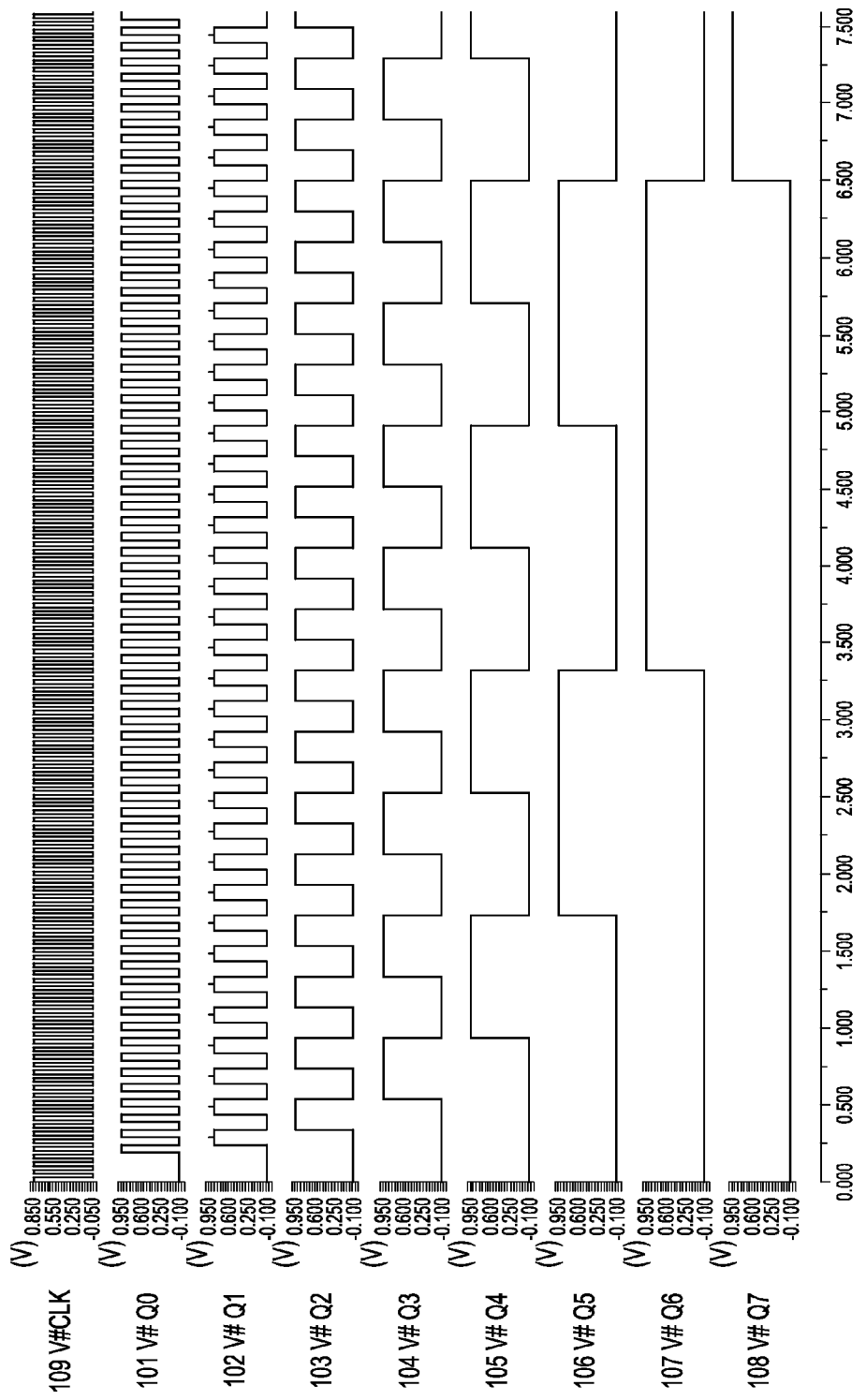
FIG. 9 is a timing diagram for a first set of signals of the circuit shown in FIG. 8 according to an embodiment of the present invention.

FIG. 9 is a timing diagram illustrating a first set of signals shown in FIG. 8 according to an example of the invention, where the first set of signals are the respective outputs of Q0 101 to Q7 108, in relation to the base clock signal CLK 109. In summary, each higher-order output bit operates at half the frequency of the previous output bit, in order to provide the (upwards, for this example) binary count output when summed together.

FIG. 10 is a timing diagram illustrating a second set of signals shown in FIG. 8 according to an example of the invention, where the second set of signals are the signal outputs of the respective CGICs, i.e., the gated clocks CLK-2,3 801, CLK-4,5 802, CLK-6-7 803 which are the clock inputs to the respective counter sub-modules CNT-2,3; CNT-4,5; and CNT-6,7 of FIG. 8. FIG. 10 has four waveforms where the top-most signal is the base clock signal CLK 109, below which is CLK-2,3 801 (the reduced rate clock signal for the second of the 2-bit counter sub-modules, which deals with the overall counter output bits Q2 and Q3), followed by CLK-4,5 802 (the further-reduced rate clock signal for the third 2-bit counter sub-modules, which deals with the overall counter output bits Q4 and Q5), and followed by CLK-6,7 803 (the yet-further-reduced rate clock signal for the fourth 2-bit counter sub-module, which deals with the overall counter output bits Q6 and Q7). If the base clock signal CLK 109 is assumed to be a signal of frequency X, then the signal CLK-2,3 801 has a toggling frequency of X/4 which means that the counter module CNT-2,3 ($400_{2,3}$) would toggle at a frequency of X/4. Similarly, the 2-bit counter sub-module CNT-4,5 would toggle at a frequency of X/16, and the 2-bit counter sub-module CNT-6,7 would toggle at a frequency of X/64. Since dynamic power of an integrated circuit is directly dependent on the operating frequency, the proposed counter circuit consumes less dynamic power as compared to conventional approaches, because higher-order portions are clocked at a lower rate, or not at all.

Figure 11A:
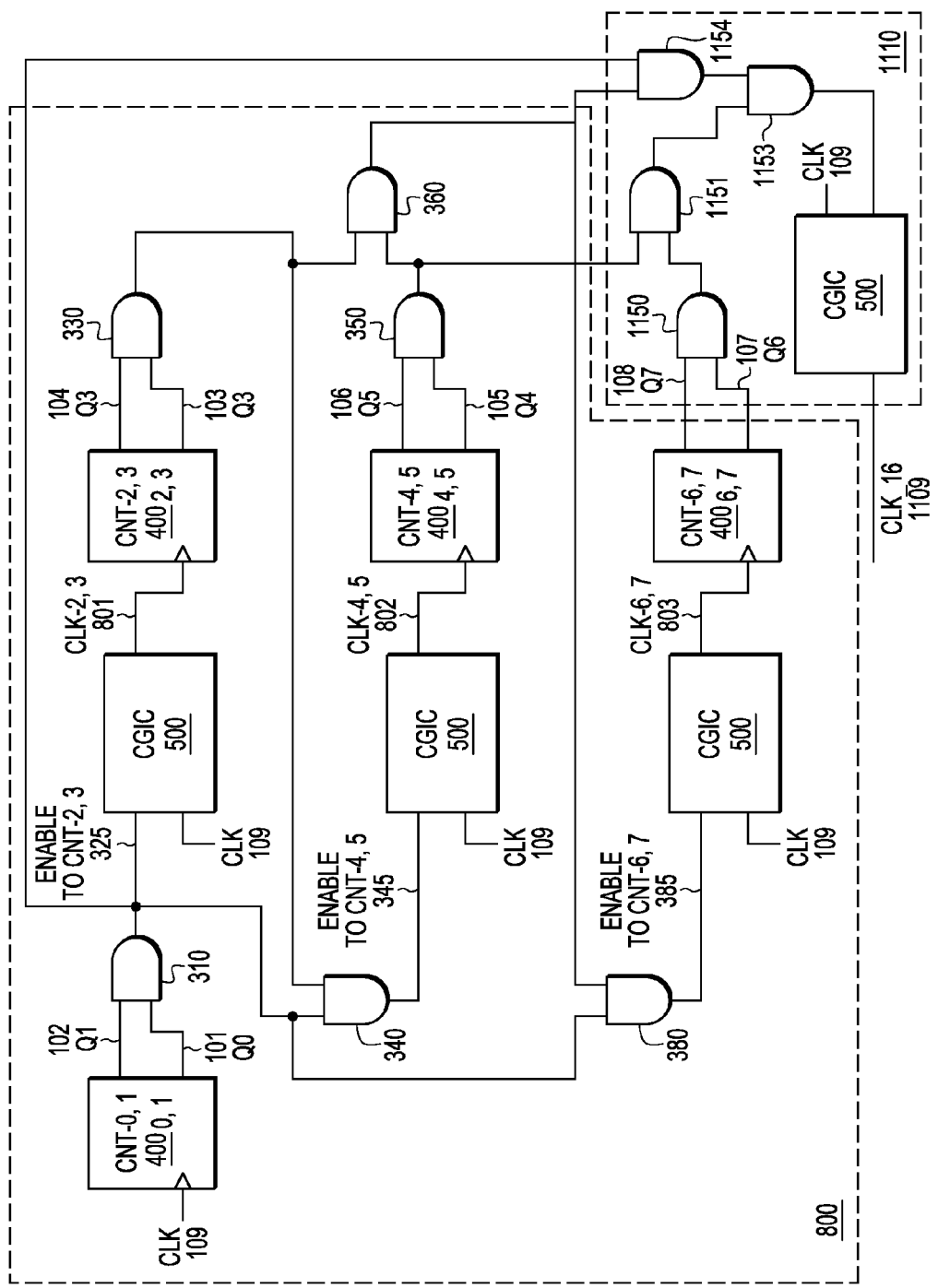
FIG. 11A is the first portion of a schematic block diagram of a 16-bit counter in accordance with an embodiment of the present invention.
Figure 11B:
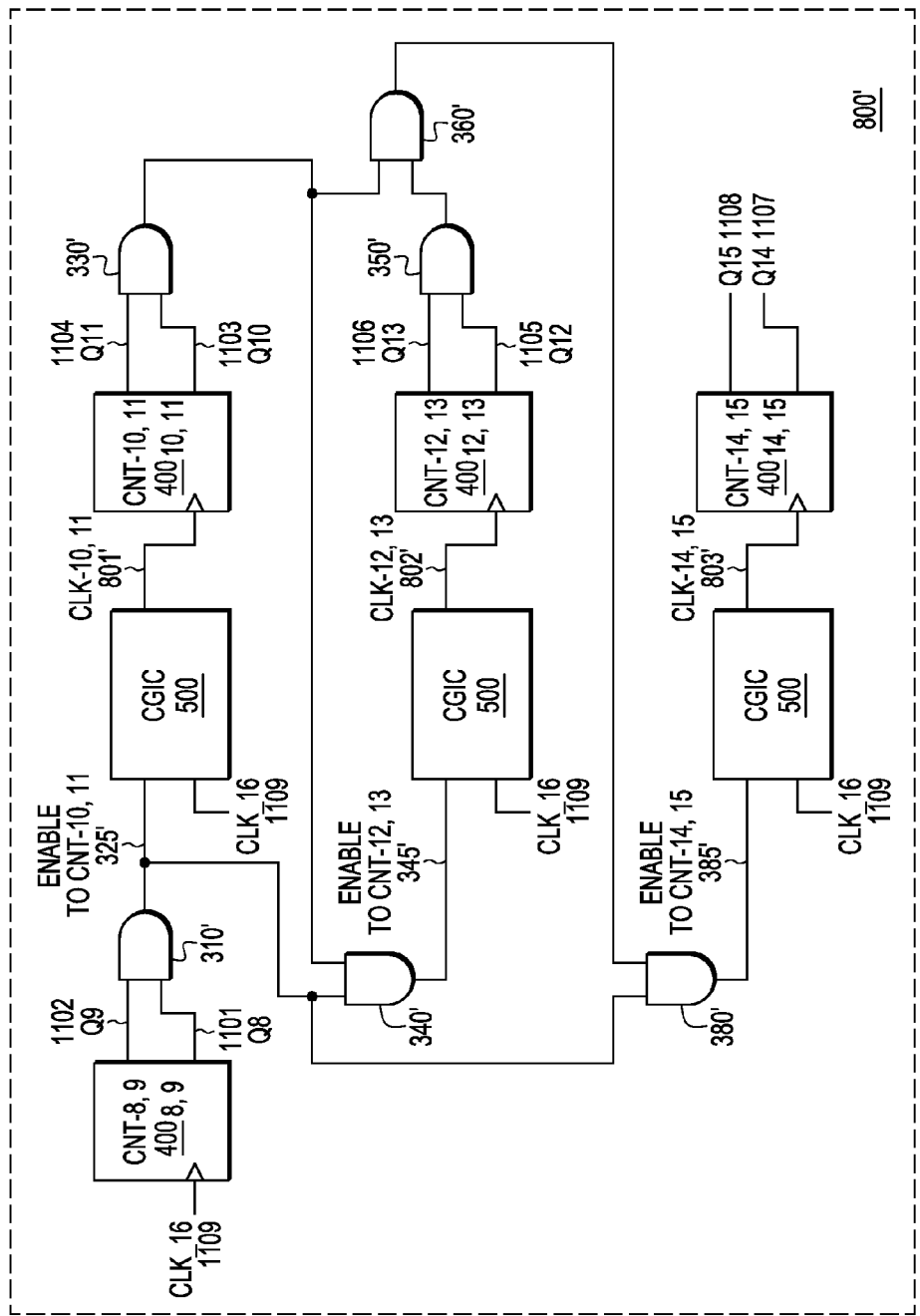
FIG. 11B is the second portion of a schematic block diagram of a 16-bit counter in accordance with an embodiment of the present invention.
Figure 12:
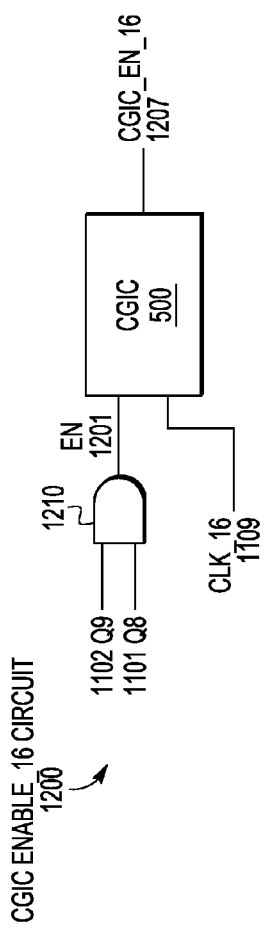
FIG. 12 is a schematic block diagram of a second CGIC enable control circuit for a second portion of a counter circuit in accordance with an embodiment of the present invention.

FIG. 11 is a schematic block diagram illustrating an overall 16-bit digital counter circuit according to an example of the invention, formed from the same 8-bit counter 800 of FIG. 8, but further including a second 8 bit counter portion 800' arranged to operate for bits Q8 to Q15 (in a similar fashion to how the 8-bit portion 800 operates for bits Q0 to Q7), and with a connective logic portion 1110. The second 8 bit counter portion 800' acts like Q0 is equivalent to Q8, and Q1 is equivalent to Q9, etc. The connective logic portion 1110 comprises four two-input AND gates 1150, 1151, 1153, and 1154 all operatively coupled together to control a further CGIC 500 under operation of the base clock signal CLK 109. The output of the CGIC 500 in the connective logic portion 1110 is referred to as CLK_16 1109, and is used as a clock signal in the second 8-bit counter portion 800' corresponding to the use of the base clock signal CLK 109 in the first 8-bit counter portion 800. FIG. 12 is a schematic block diagram illustrating a second CGIC enable control circuit for a second portion of a counter circuit. The other control logic change, compared to the standard 8-bit counter 800, is the use of a CGIC_enable_16 signal 1207, from the CGIC_enable_16 circuit 1200, an example of which is shown in more detail in FIG. 12, from where it can be seen that it is of the same construction as the CGIC enable circuit in FIG. 6, but where the two inputs are Q8 1101 and Q9 1102 instead of Q0 101 and Q1 102. Again, the enable signal 1201 may be derived directly from a combinatorial control logic gate (as shown in the FIG. 12).

A 32-bit counter may be provided based on the principle described herein in a similar way, i.e., re-using suitable portions, such as, for example, using two 16-bit counter sub-portions together (which themselves are each two 8-bit portions suitably linked together, as shown in FIG. 11). In this case, the second 16-bit block may utilize a CLK_32 clock signal, derived in a similar fashion to CLK_16 shown in FIG. 11, but going down to a lower frequency that is a fraction of CLK_16.

Figure 13:
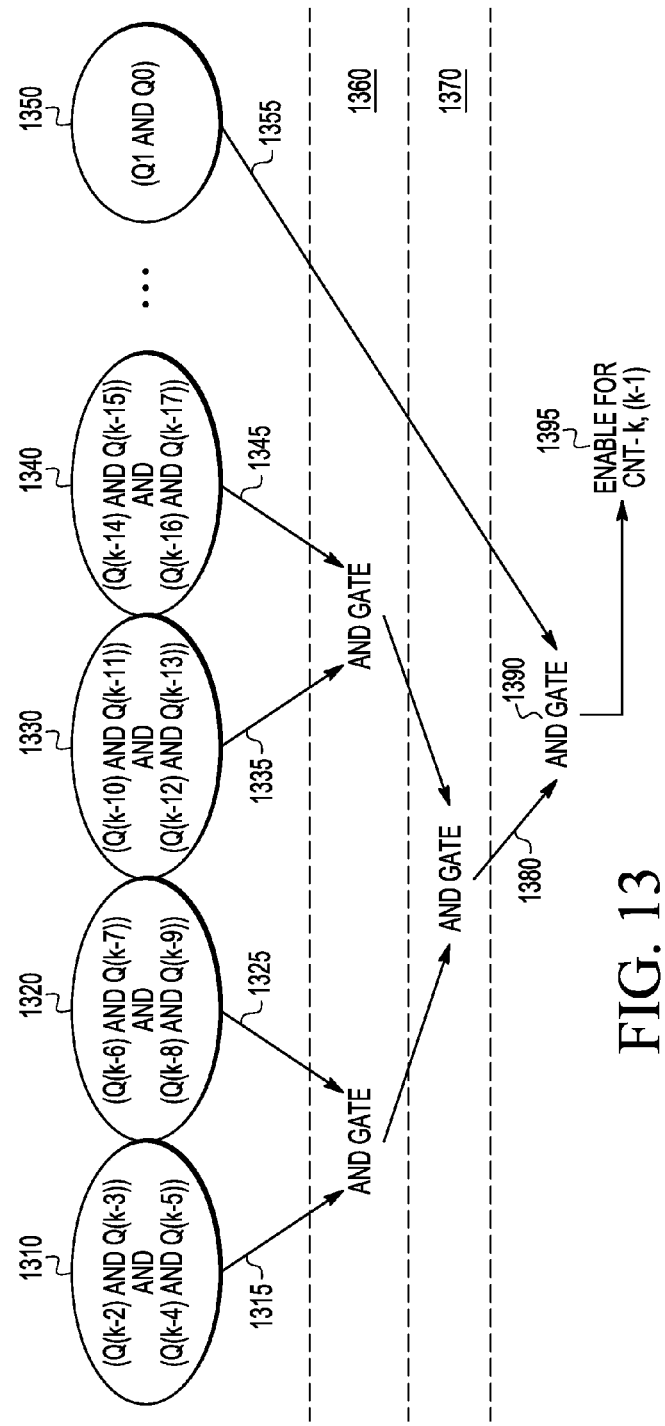
FIG. 13 illustrates generic counter enable logic for an n-bit counter using 2-bit counter sub-modules in accordance with an embodiment of the present invention.

FIG. 13 is a graphical representation illustrating an example of generic counter enable logic for the CNT-n, (n−1)th module of any higher-order digital counter circuit according to an example of the invention that uses 2-bit counter sub-modules. The top row shows a number of logical ANDings—depicted as ovals 1310 to 1350—which adhere to the restrictions noted above, i.e., being up to dual, 2-input AND logic gates. They are shown starting with the equation operating on the most-significant bits on the left, moving down to the least-significant bits on the right, and the naming protocol in use in the figure is where the variable "k" is the order of the most-significant bit of an overall (k+1)-bit digital counter circuit to be described by the figure. For example, for a 16-bit counter, having bits designated Q0 through Q15, "k" would be n−1, or 15. Similarly, for an 8-bit counter, having bits designated Q0 through Q7, "k" would be 7.

Thus, for example, the left-most logical ANDing 1310 is: ((Q(k−2) AND Q(k−3)) AND (Q(k−4) AND Q(k−5))), so that, if a 16-bit overall counter is being described, 'k'=15, which means the equation resolves to: ((Q(15−2) AND Q(15−3)) AND (Q(15−4) AND Q(15−5)))=((Q13 AND Q12) AND (Q11 AND Q10)).

The next logical ANDing 1320 is: ((Q(k−6) AND Q(k−7)) AND (Q(k−8) AND Q(k−9))), so that, if a 16-bit overall counter is being described, 'k'=15, which means the equation resolves to: ((Q(15−6) AND Q(15−7)) AND (Q(15−8) AND Q(15−9)))=((Q9 AND Q8) AND (Q7 AND Q6)). The system continues in the same way for the other logical ANDings 1330, 1340, etc. Note that the figure is generalized, and so the number of logical ANDings vary with the bit depth of the overall digital counter circuit being created.

Similarly, if an 8-bit overall digital counter circuit is being described by the figure, 'k'=7, which means the equation resolves to: ((Q(7−2) AND Q(7−3)) AND (Q(7−4) AND Q(7−5))(=((Q5 AND Q4) AND (Q3 AND Q2)), etc. This process continues until the final AND logic gate, which is always an AND combination of the least-significant bits.

As mentioned above, each of the logical ANDings 1310-1340 match the restrictions on the fan-in of the control logic noted above. The output from the AND gates 1310, 1320, 1330, and 1340, respectively, the outputs 1315, 1325, 1335, and 1345, each may form one input to another 2-input AND gate at a first tier 1360 of the next set of combinatorial control logic, with those AND gates in the first tier 1360 providing the inputs to the second tier 1370 2-input AND gate, as shown in the FIG. 13. The logic continues on in this arrangement of using 2-input logic gates until there is just one output which will, in the end, be ANDed with the LSBs (i.e., (Q1 AND Q0)) by the final AND gate 1390, whose output is the enable signal for the next counter sub-module 1395.

Figure 14:
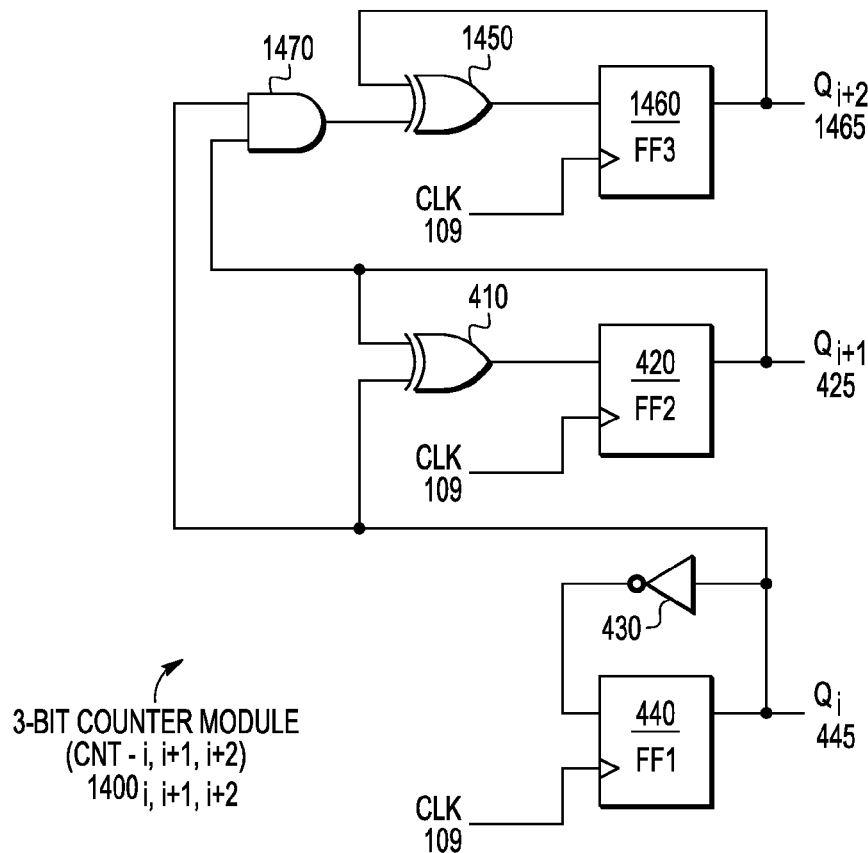
FIG. 14 is a schematic block diagram of a 3-bit counter sub-module in accordance with an embodiment of the present invention.

FIG. 14 is a schematic block diagram illustrating an example 3-bit counter sub-module $1400_{t,i+1,i+2}$ according to an example of the invention. It is in a form very similar to the 2-bit counter sub-module shown in FIG. 4 (and utilizes the same reference numerals for analogous items), except it now has an additional two logic gates (the AND gate 1470 and the XOR gate 1450) and a third flip-flop 1460, which produces the further counter module output $Q_{i+2}$ 1465. This circuit operates as a basic 3-bit counter.

Figure 15:
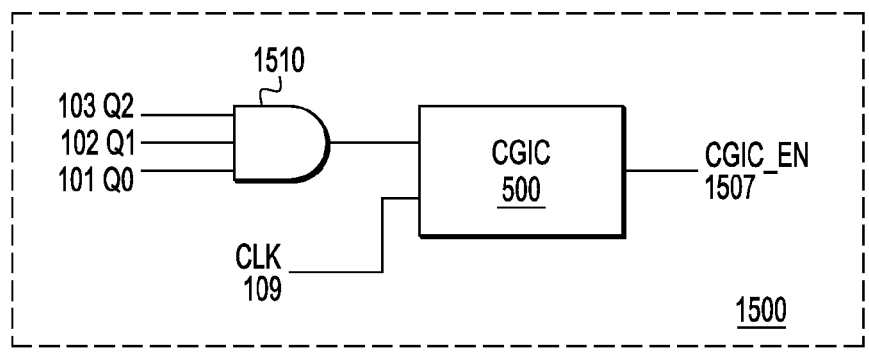
FIG. 15 is a schematic block diagram of a CGIC for use in clock gating the counter modules of FIG. 14 when they are not changing state according to an embodiment of the present invention.

FIG. 15 is a schematic block diagram illustrating an example of a CGIC 1500 for use in clock gating the lower-order 3-bit counter sub-module, as shown in FIG. 14 when the three lower-order bits are not changing their states, according to an example of the invention. It can be seen that this is essentially similar to the CGIC of FIG. 5, except it now utilizes a 3-input AND gate 1510 instead of the 2-input AND gate described previously for use in a digital counter circuit utilizing 2-bit counter sub-modules. This 3-input AND gate 1510 produces the respective enable signal, e.g., the enable signal 1507. This formation fits into the above-described generalized limitation on the cone size (i.e., fan-in).

Figure 16:
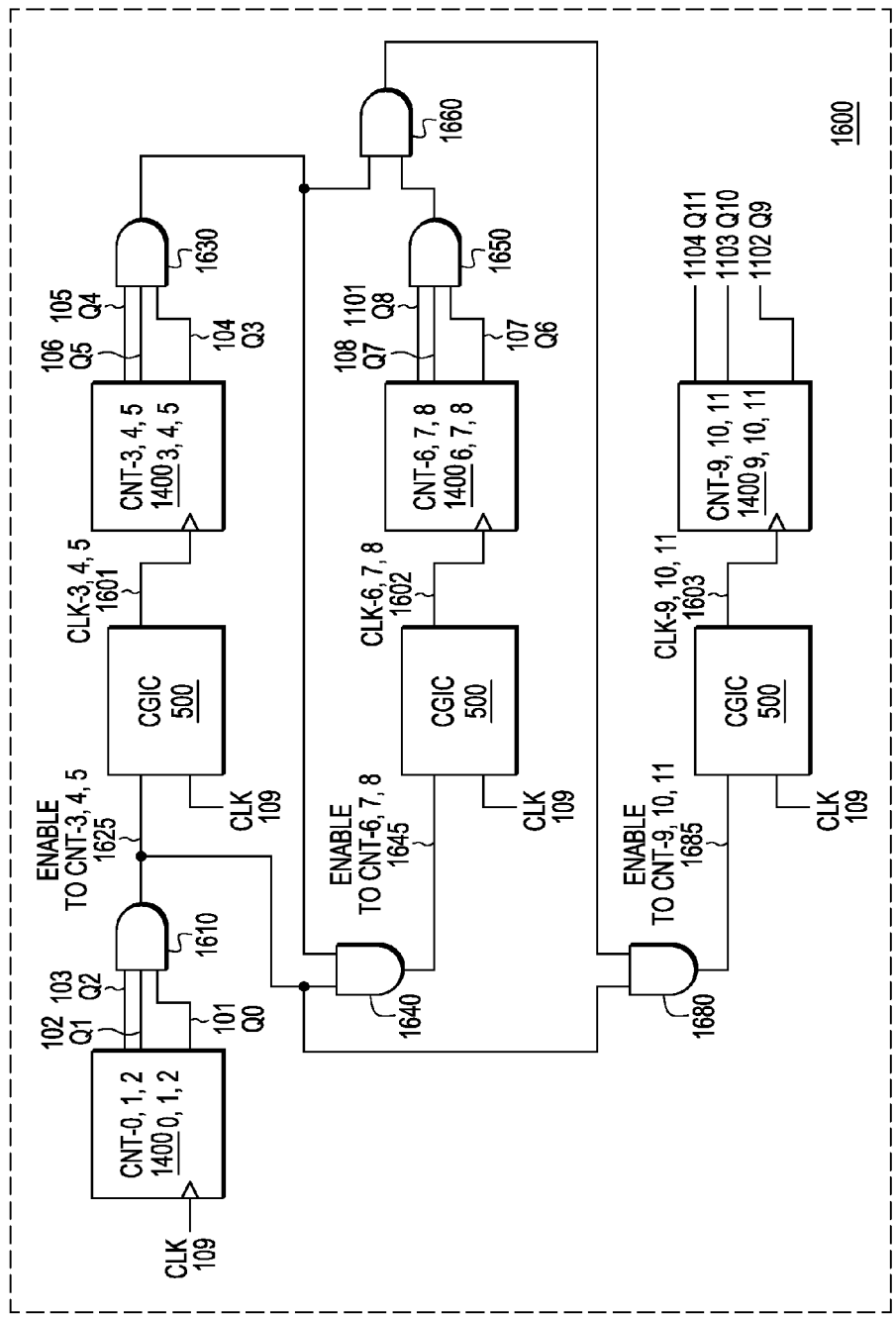
FIG. 16 is a schematic block diagram of a 12-bit counter according to an example of the present invention that uses a plurality of 3-bit counter sub-modules of FIG. 14.

FIG. 16 is a schematic block diagram illustrating a 12-bit counter 1600 according to an example of the invention that utilizes a plurality of 3-bit counter sub-modules (e.g., from FIG. 14), instead of the 2-bit counter sub-modules of FIG. 7, 8, or 11. The formation of the 12-bit counter is largely the same as shown in and described with reference to FIG. 8 above, except the first-tier AND gates 1610, 1630, and 1650 are all 3-input (while the second-tier AND gates 1640 and 1660 remain 2-input). The rest of the figure corresponds to that shown in FIG. 8, except for the remaining reference numbers being converted to start with '16' rather than '8', to match the figure number.

Thus, the 12-bit counter circuit 1600 starts off with a first 3-bit counter sub-module CNT-0,1,2 $1400_{0,1,2}$, clocked by the base clock signal 109, followed by a second 3-bit counter sub-module CNT-3,4,5 $1400_{3,4,5}$, clocked by the reduced-rate clock signal CLK-3,4,5 1601 which is one-eighth of the clock rate at the output of CNT-0,1,2 $1400_{0,1,2}$.

Similarly, a third 3-bit counter sub-module CNT-6,7,8 $1400_{6,7,8}$, is clocked by the further-reduced-rate clock signal CLK-6,7,8 1602, and a fourth 3-bit counter sub-module CNT-9,10,11 $1400_{9,10,11}$, is clocked by the yet-further-reduced-rate clock signal CLK-9,10,11 1603.

Each clocking signal (e.g. 1601, 1602, and 1603) is provided by the output of a respective CGIC controlled by a respective combinatorial control logic instance that provides the enable signal (e.g., the enable signal to CNT-3,4,5 1625) to the CGIC 500. In this example, since the counter sub-modules in use are 3-bit counter sub-module, each respective combinatorial control logic instance is formed from 3-input AND gates (e.g., the AND gate 1610) in the first tier, into a 2-input AND gate in the second tier (e.g., AND gate 1640) whose other input is the output of another 3-input AND gate (e.g., the AND gate 1630) combining the next set of bits (e.g., the bits Q3, Q4, and Q5).

Figure 17:
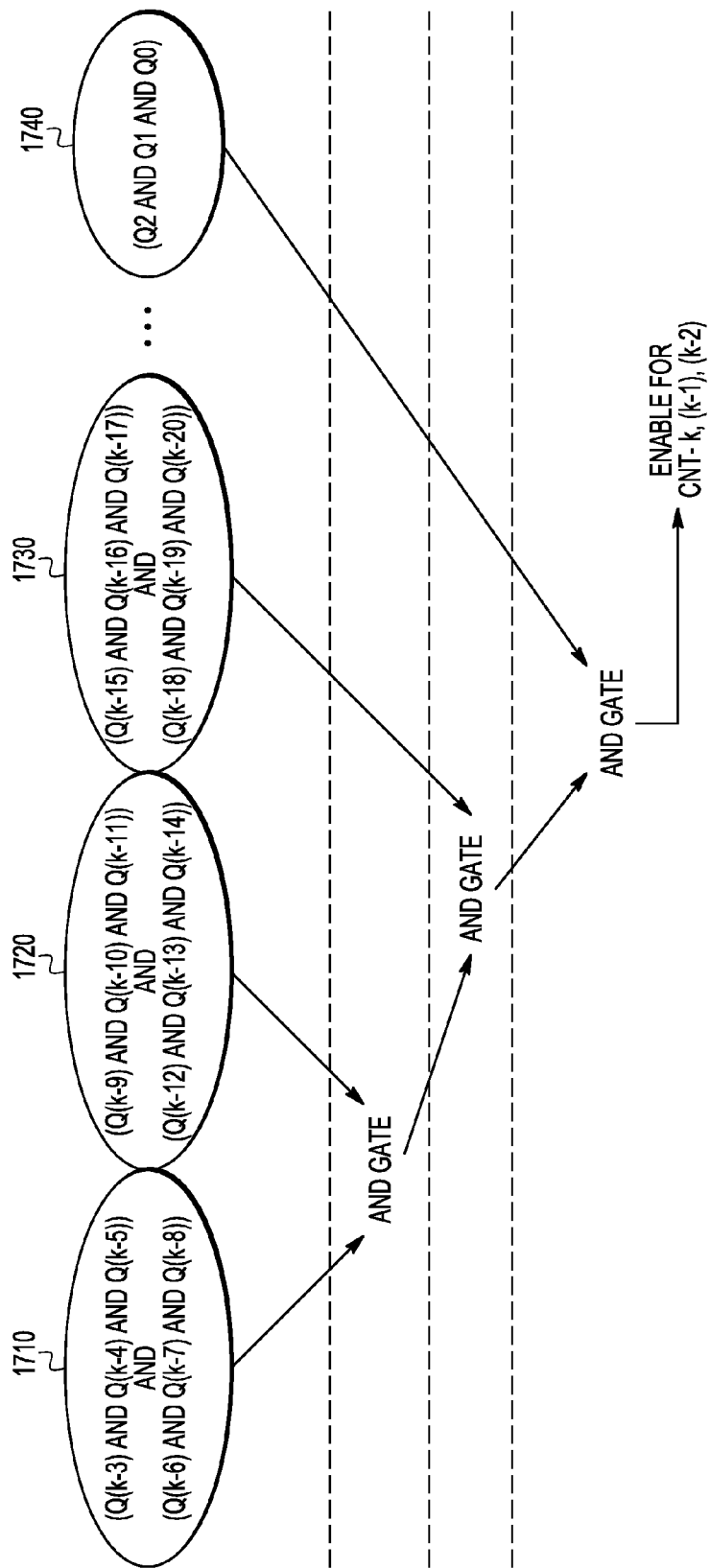
FIG. 17 illustrates generic counter enable logic for an n-bit counter using 3-bit counter sub-modules in accordance with an embodiment of the present invention.

FIG. 17 is a graphical representation illustrating a generic counter enable logic for an n-bit counter using 3-bit counter sub-modules according to an example of the invention. This is again similar to that shown in FIG. 13, but extrapolated out for using the 3-input AND gates, where appropriate. For example, each of the left-most circled logic combinations at the top of the figure (i.e., items 1710, 1720, and 1730) are the combination by a 2-input AND gate of the outputs of two 3-input AND gates. The right-most circled logic (i.e., for the 3 LSBs) is a single 3-input AND gate. Outputs from a first tier of logic gates are coupled to provide inputs to a second tier of AND gates, illustrated as 2-input AND gates but embodiments of the invention are not limited to 2-input AND gates.

As will be appreciated, increasing the fan-in of any logic restricts its potential maximum operating frequency. This applies to all the control logic described herein, and, as such, this means the examples using 2-bit counter sub-modules may operate at a higher frequency than examples using higher-order (i.e., higher-bit-depth) counter sub-modules, e.g., 3-bit counter sub-modules of FIG. 14, 4-bit counter sub-modules, etc.

The described technique is particularly applicable to all counters that are higher order than 4-bit (i.e. 5-bit+counters), since this is where the combinatorial control logic would otherwise start to increase its fan-in. In general terms, the fan-in (i.e., number of inputs) of the first tier of control logic gates matches the bit depth of the respective counter sub-modules in use, and the second tier of AND gates, while illustrated as 2-input AND gates, does not limit embodiments of the invention to be 2-input AND gates. Higher tiers of logic, when associated with a higher-order counter sub-module, are not limited to the bit depth of the respective higher-order counter sub-module Thus, when using 2-bit counter sub-modules (the fastest, optimum, formation of a counter), the first tier is two-input. Whereas, if an example is to use 3-bit counter sub-modules, the first tier is 3-input, or if using 4-bit counter sub-modules, the first tier is 4-input, etc.

In the foregoing specification, the term 'clock gating', e.g., of the respective 2-bit, 3-bit, or higher-order bit-depth counter sub-modules, is used. The clock gating described generally involves a flip-flop or multiple flip-flops, within the counter sub-modules, that do not receive a direct clock signal, but receive a clock signal from the output of a clock-gating integrated cell depicted, for example, in FIG. 5, whose enable is controlled in a manner such that it would stop the clock to those flip-flops in higher-order counter sub-modules when the respective flip-flop outputs are not required to change. Clock gating a flip-flop(s) means that you are "gating" (in layman's term: stopping) the clock to that particular flip-flop(s). Every flip-flop receives a "clock" signal. Even if the output (normally represented by Q) of a flip-flop does not change, it still continues to consume dynamic power as long as it is receiving a clock signal. In order to save power, it is therefore desired to "gate-the-clock" during periods of time when the output of the respective flip-flop is not required to change.

Also for purposes of this description, the terms "couple," "couples," "coupling," "coupled," "connect," "connects," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes, ports, or paths may be referred to by the same name and are interchangeable for purposes here.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless stated otherwise, terms such as "first" and "second" are used to arbitrarily distinguish between the elements such terms describe. Thus, these terms are not necessarily intended to indicate temporal or other prioritization of such elements. Further, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The invention claimed is:

1. An n-bit counter circuit, comprising:
a plurality of cascaded counter sub-modules including at least first and second cascaded counter sub-modules, the first counter sub-module being at least a lower-order counter sub-module relative to the second counter sub-module, the second counter sub-module being a higher-order counter sub-module relative to the first counter sub-module, as well as being a lower-order counter sub-module relative to subsequent cascaded counter sub-modules; and
control logic coupled to the first counter sub-module, wherein:
the control logic includes a clock-gating integrated cell (CGIC) that clocks at least the second counter sub-module dependent on a logical combination of outputs of at least the first counter sub-module, and provides a multi-cycle path for resolution of a logical combination of outputs of any subsequent cascaded counter sub-modules dependent on a logical combination of the outputs of at least the second counter sub-module; and
the control logic does not include any intervening memory device between the first counter sub-module and the CGIC for use in resolution of a logical combination of outputs,
wherein:
the CGIC is coupled between the first counter sub-module and the second counter sub-module and controls a clock input of the second counter sub-module;
the CGIC comprises a latch having an output operatively coupled to a first input of a two-input AND gate, wherein:
the latch is operated by a changing level of a clock signal;
the clock signal is operatively coupled to a second input of the two-input AND gate; and
an input to the latch is a logically ANDed output of the first counter sub-module.

2. The n-bit counter circuit of claim 1, wherein at least the n-bit counter circuit is fabricated as part of an integrated circuit.

3. The n-bit counter circuit of claim 1, wherein a fan-in of a first tier of control logic gates is equal to a bit depth of at least one of the plurality of cascaded counter sub-modules.

4. The n-bit counter circuit of claim 1, wherein:
the first counter sub-module is operable to count two least-significant bits of the counter circuit;
the second counter sub-module is operable to count a next two more-significant bits of the counter circuit;
the input to the latch is the logically ANDed output of the first counter sub-module; and
a least-significant bit input to an AND gate operably coupled to the output of the first counter sub-module is not an inverted input.

5. The n-bit counter circuit of claim 1, further comprising respective second CGICs between each consecutive pair of the plurality of counter sub-modules.

6. The n-bit counter circuit of claim 1, wherein:
the first counter sub-module is operable to count two least-significant bits of the counter circuit; and
the second counter sub-module is operable to count a next two more-significant bits of the counter circuit.

7. The n-bit counter circuit of claim 1, wherein the n-bit counter is a higher-than-4-bit counter.

8. The n-bit counter circuit of claim 1, comprising a control logic instance per instance of a higher-order counter sub-module of the counter circuit.

9. The n-bit counter circuit of claim 1, wherein the second counter sub-module of the counter circuit is the next higher-order counter sub-module after the first counter sub-module.

10. The n-bit counter circuit of claim 1, wherein:
the plurality of cascaded counter sub-modules comprises a first lowest-order counter sub-module followed by a second higher-order counter sub-module cascaded off the first lowest-order counter sub-module; and
each subsequent counter sub-module cascades off a previous counter sub-module and is a yet-higher-order counter sub-module.

11. The n-bit counter circuit of claim 1, wherein the first counter sub-module and the second counter sub-module form an initial 4-bit counter sub-portion, wherein:
the first counter sub-module is a first 2-bit counter sub-module of the initial 4-bit counter sub-portion, arranged to count two least-significant output bits Q0 and Q1 of the n-bit counter circuit;
the second counter sub-module is a second 2-bit counter sub-module of the initial 4-bt counter sub-portion, arranged to count a next two more-significant output bits Q2 and Q3 of the n-bit counter circuit;
the control logic is arranged to control a clock of the second 2-bit counter sub-module dependent on the outputs of the first 2-bit counter sub-module; and
the control logic comprises:
the CGIC operable to clock gate the second 2-bit counter sub-module, the CGIC operable to receive the logical AND combination of Q1 and Q0 without the logical combination passing through any intervening memory device.

12. The n-bit counter circuit of claim 11, wherein neither Q1 nor Q2 are inverted in the logical combination of Q1 and Q0.

13. The n-bit counter circuit of claim 12, wherein the logical combination of Q1 and Q0 is directly connected as an input to the CGIC.

* * * * *